(12) United States Patent
Anzai et al.

(10) Patent No.: US 6,661,692 B2
(45) Date of Patent: Dec. 9, 2003

(54) SEMICONDUCTOR INTEGRATED CIRCUIT

(75) Inventors: Shinsuke Anzai, Tenri (JP); Kenji Kamei, Kyoto (JP); Yasumichi Mori, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/179,710

(22) Filed: Jun. 24, 2002

(65) Prior Publication Data

US 2003/0011004 A1 Jan. 16, 2003

(30) Foreign Application Priority Data

Jun. 26, 2001 (JP) ........................................ 2001-192712

(51) Int. Cl.$^7$ ................................................. G11C 5/06
(52) U.S. Cl. ............................ 365/63; 365/49; 365/51; 365/200; 365/230.03
(58) Field of Search ............................ 365/200, 49, 63, 365/51, 230.03

(56) References Cited

U.S. PATENT DOCUMENTS 5,835,505 A  * 11/1998 Nishimichi et al. ......... 714/724
6,021,061 A  *  2/2000 Kato et al. .................... 365/51
6,243,279 B1 *  6/2001 Maesako et al. .............. 365/49

FOREIGN PATENT DOCUMENTS

JP          7-161184         6/1995

* cited by examiner

Primary Examiner—Hoai Ho
(74) Attorney, Agent, or Firm—Morrison & Foerster LLP (57) ABSTRACT

A semiconductor integrated circuit of the present invention includes: n first output circuits and m second output circuits which are provided such that adjacent first and second output circuits are spaced at a regular first pitch; and input circuits which are provided such that adjacent input circuits are spaced at a regular second pitch, in which the first and second output circuits are provided such that at least part of ones of the first and second output circuit blocks alternate with the other ones of the first and second output circuits and each of the first output circuits is connected to a corresponding one of input circuits by a first conductor line which is kept straight, and second conductor lines are connected to the second output circuits such that each second conductor line passes through a gap between the input circuits.

8 Claims, 5 Drawing Sheets

SEMICONDUCTOR INTEGRATED CIRCUIT

BACKGROUND OF THE INVENTION

1. Field of the Invention

The present invention relates to a semiconductor integrated circuit, and more particularly to a semiconductor integrated circuit used as a semiconductor memory device or the like having a redundancy relief function for substituting a normal memory cell for a malfunctioning memory cell.

2. Description of the Related Art

A conventionally-known semiconductor integrated circuit includes a plurality of adjacent output circuit blocks having the same circuit layouts, i.e., shapes and areas of the output circuit blocks, positions of signal terminals thereof, etc., are the same, and a plurality of adjacent input circuit blocks having the same circuit layouts. In the conventionally-known semiconductor integrated circuit, an output signal provided from each output circuit block is input to a corresponding one of the input circuit blocks.

Further, in the case of connecting the input circuit blocks and the output circuit blocks using conductor lines, when a pitch between adjacent output circuit blocks is identical to that between corresponding adjacent input circuit blocks, the input and output circuit blocks can be connected using straight conductor lines such that a distance between the input circuit blocks and their corresponding output circuit blocks is the shortest possible, and therefore there are no unnecessary areas in the circuit layout. On the contrary, when the pitch between the adjacent output circuit blocks is not identical to the pitch between the adjacent input circuit blocks, the conductor lines for connecting the input and output circuit blocks are required to be bent so as not cross one another avoiding a short circuit, thereby increasing an area of a conductor region in which the conductor lines are provided.

One example of such a semiconductor integrated circuit having input and output circuit blocks is a flash memory which is a nonvolatile semiconductor memory. In general, the flash memory includes spare flash memory cells. When there is a malfunction in a main memory cell, the spare flash memory cell is substituted for the malfunctioning main memory cell (malfunctioning memory cell) such that data read/write operations or the like can be performed on the spare flash memory cell. By providing the spare flash memory cells, it is possible to suppress the occurrence of defects, thereby improving the yield of the flash memories. The flash memory usually uses a redundant circuit so as to substitute the spare flash memory cell for the malfunctioning memory cell. The redundant circuit includes a memory circuit for storing address information of the malfunctioning memory cell when the malfunctioning memory cell is present and a redundancy relief comparison circuit for comparing the address information of the malfunctioning memory cell and address information externally input to the redundant circuit.

In a DRAM, SRAM or the like, which are volatile semiconductor memories, a plurality of fuses made of polysilicon, metal or the like are provided. In order to store the address information of the malfunctioning memory cell, the plurality of fuses are electrically disconnected, for example. On the contrary, in the flash memory which is a nonvolatile semiconductor memory, for example, memory cells, which are nonvolatile semiconductor memory elements, are used instead of using fuses so as to store address information of a malfunctioning memory cell on which redundancy relief is performed and other information specific to the flash memory. The memory circuit using the memory cells which are the nonvolatile semiconductor memory elements is referred to as a CAM (contents addressable memory) circuit.

Figure 2:
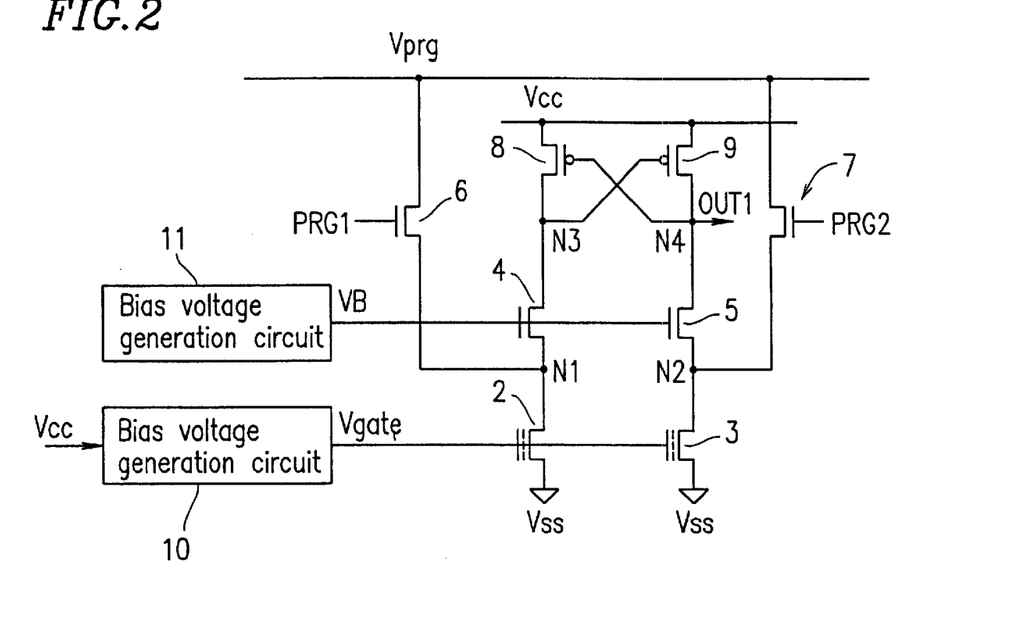
FIG. 2 is a circuit diagram for explaining a structure of a conventional CAM circuit.

As shown in FIG. 2, a CAM circuit usually includes two floating gate-type transistors 2 and 3, four N-type transistors 4, 5, 6 and 7, and two P-type transistors 8 and 9.

The P-type transistor 8, the N-type transistor 4 and the floating gate-type transistor 2 are serially connected together in this order. A power supply voltage VCC is applied to a source of the P-type transistor 8. The floating gate-type transistor 2 is connected to a drain of the P-type transistor 8 via the N-type transistor 4. A ground potential Vss is applied to a source of the floating gate-type transistor 2. Similarly, the P-type transistor 9, the N-type transistor 5 and the floating gate-type transistor 3 are serially connected together in this order. The power supply voltage VCC is applied to a source of the P-type transistor 9. The floating gate-type transistor 3 is connected to a drain of the P-type transistor 9 via the N-type transistor 5. The ground potential Vss is applied to a source of the floating gate-type transistor 3.

An output Vgate is provided by a bias voltage generation circuit 10 to a gate of each of the floating gate-type transistors 2 and 3. An output VB is provided by a bias voltage generation circuit 11 to a gate of each of the N-type transistors 4 and 5. A gate of the P-type transistor 8 is connected to a node N4 to which the P-type transistor 9 and the N-type transistor 5 are connected. A gate of the P-type transistor 9 is connected to anode N3 to which the P-type transistor 8 and the N-type transistor 4 are connected. A program voltage Vprg is applied by a voltage supply circuit (not shown) to a drain of each of the N-type transistors 6 and 7. Program signals PRG1 and PRG2 are applied by their respective control circuits (not shown) to gates of the N-type transistors 6 and 7, respectively. A source of the N-type transistor 6 is connected to a node N1 to which the floating gate-type transistor 2 and the N-type transistor 4 are connected. A source of the N-type transistor 7 is connected to a node N2 to which the floating gate-type transistor 3 and the N-type transistor 5 are connected.

The CAM circuit configured as described above can store only one bit of address information of the malfunctioning memory cell on which redundancy relief is performed. A plurality of CAM circuits together store the entire address information of the malfunctioning memory cell. When the CAM circuit stores one bit of the address information of the malfunctioning memory cell, an output terminal OUT1 of the CAM circuit is connected to a redundancy relief address comparison circuit (not shown). Outputs from the plurality of CAM circuits which together store the address information of the malfunctioning memory cell are compared to an externally-input address by the redundancy relief comparison circuit. When the comparison results in a mismatch, access to a memory cell corresponding to the externally-input address is performed. When the comparison results in a match, access to the spare memory cell is performed. Also, it is possible to store information specific to the memory device, such as a device code, in the CAM circuit. In this case, the output terminal OUT1 of the CAM circuit is connected to a buffer circuit or the like.

Since the CAM circuit includes two flash memory cells each being similar to the main memory cell, a circuit layout with respect to a position in which the CAM circuit is provided, a pitch between the CAM circuits, etc., is considerably restricted by a layout of the main memory cells.

Figure 3:
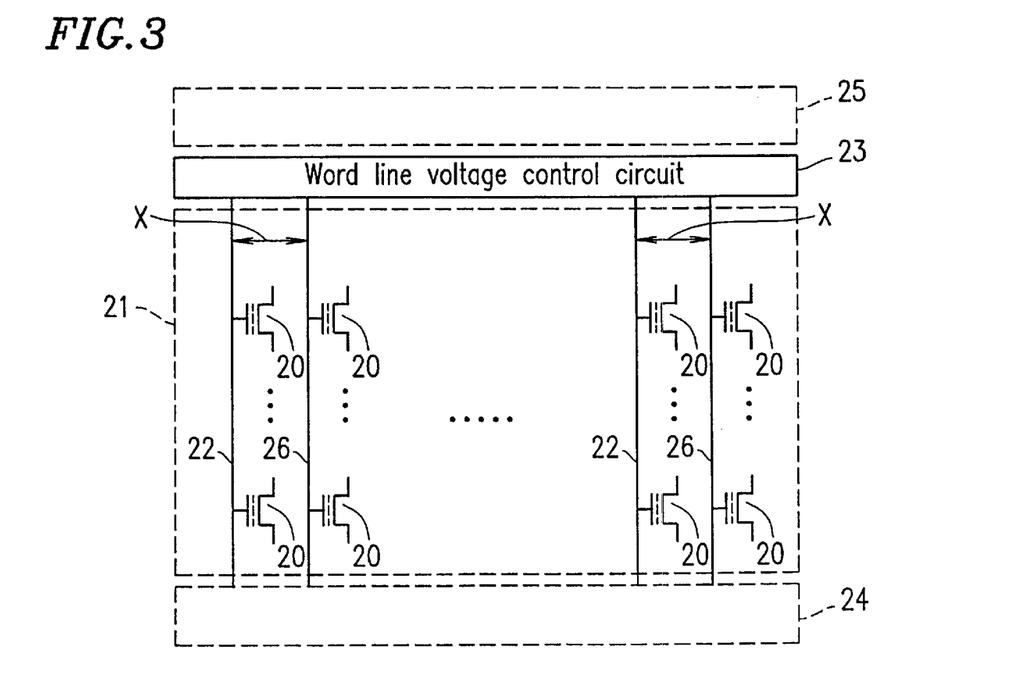
FIG. 3 is a circuit diagram showing the position of the conventional CAM circuit in a conventional memory device.

FIG. 3 is a diagram for explaining that the position of the CAM circuit is restricted by the layout of the main memory cells. In FIG. 3, the flash memory includes in a main memory region 21 a plurality of floating gate-type transistors 20 which are the flash memories constituting the main memory and are provided in a matrix form. Each control gate of the plurality of floating gate-type transistors (flash memory cells) 20 provided in one direction is connected to word lines 22 or 26 (i.e., the word lines 22 are provided in odd columns and word lines 26 are provided in even columns). The word lines 22 and 26 are connected to a word line voltage control circuit 23. When the word line voltage control circuit 23 controls an operation so as to write/read/erase data in/from/from the flash memory cell 20, the externally-input address information is decoded so as to select one of the word lines 22 or 26 corresponding to the decoded address information, and then a voltage having a prescribed value is applied to the selected word lines 22 or 26.

In FIG. 3, the CAM circuit is positioned in regions 24 or 25 which are provided so as to adjacent to the main memory region 21 along a direction perpendicular to the word lines 22 and 26. Although the position of the CAM circuit is restricted by the layout of the main memory cells, by providing the CAM circuit and the main memory cell region 21 so as to be adjacent to each other, a decoder element which constitutes the word line voltage control circuit 23 is shared by the main memory and the CAM circuit, thereby suppressing an increase in area of a semiconductor chip.

Figure 4:
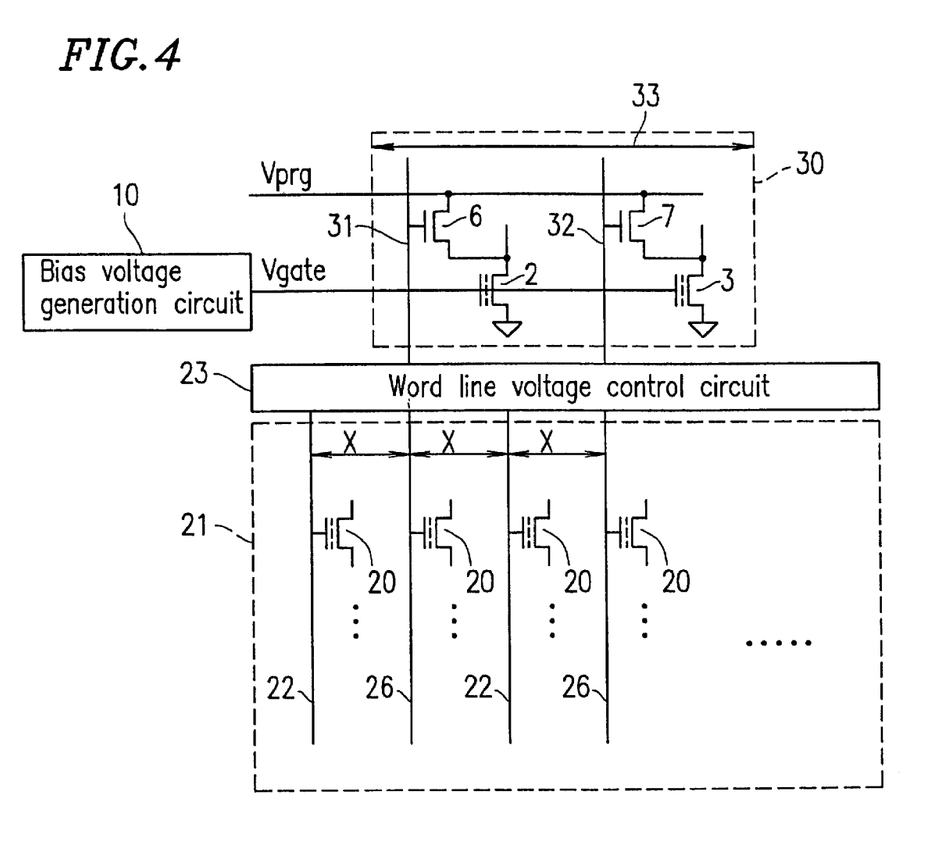
FIG. 4 is a circuit diagram for explaining that a pitch between the conventional CAM circuits is restricted by a position of main memory cells.

FIG. 4 is a diagram for explaining that the pitches between a plurality of CAM circuits are restricted by the layout of the main memory cells. In FIG. 4, the plurality of CAM circuits are provided in the region 25 shown in FIG. 3. Although not fully shown in FIG. 4, the plurality of CAM circuits each having a same structure as that of a CAM circuit 30 are provided along the word line voltage control circuit 23.

In FIG. 4, the sources of the N-type transistors 6 and 7 are respectively connected to the drains of the floating gate-type transistors (flash memory cells) 2 and 3 included in the CAM circuit 30. The N-type transistors 6 and 7 serve as switches for applying the voltage Vprg to the drains of the floating gate-type transistors 2 and 3. The gates of the N-type transistors 6 and 7 are respectively connected to word lines 31 and 32. Therefore, the pitches between the plurality of CAM circuits 30 are restricted by pitches between the word lines 31 and 32.

For example, as shown in FIG. 4, each CAM circuit 30 includes two flash memory cells 2 and 3. When the word lines 31 and 32 are connected to a corresponding one of two adjacent even word lines 26 among the odd word lines 22 and the even word lines 26 in the main memory region 21, the word line 31 is connected to the gate of the N-type transistor 6 included in the CAM circuit 30 and the word line 32 is connected to the gate of the N-type transistor 7 included in the CAM circuit 30, length 33 of the CAM circuit 30 along the longitudinal direction thereof corresponds to a length of 4x (i.e., four times the length of x shown in FIG. 4) of a region including the two adjacent even word lines 26. In this manner, the pitch between the word lines 31 and 32 of the CAM circuit 30 is restricted by the layout of the main memory cells, and therefore the pitches between the plurality of CAM circuits 30 are restricted by the layout of the main memory cells.

Figure 5:
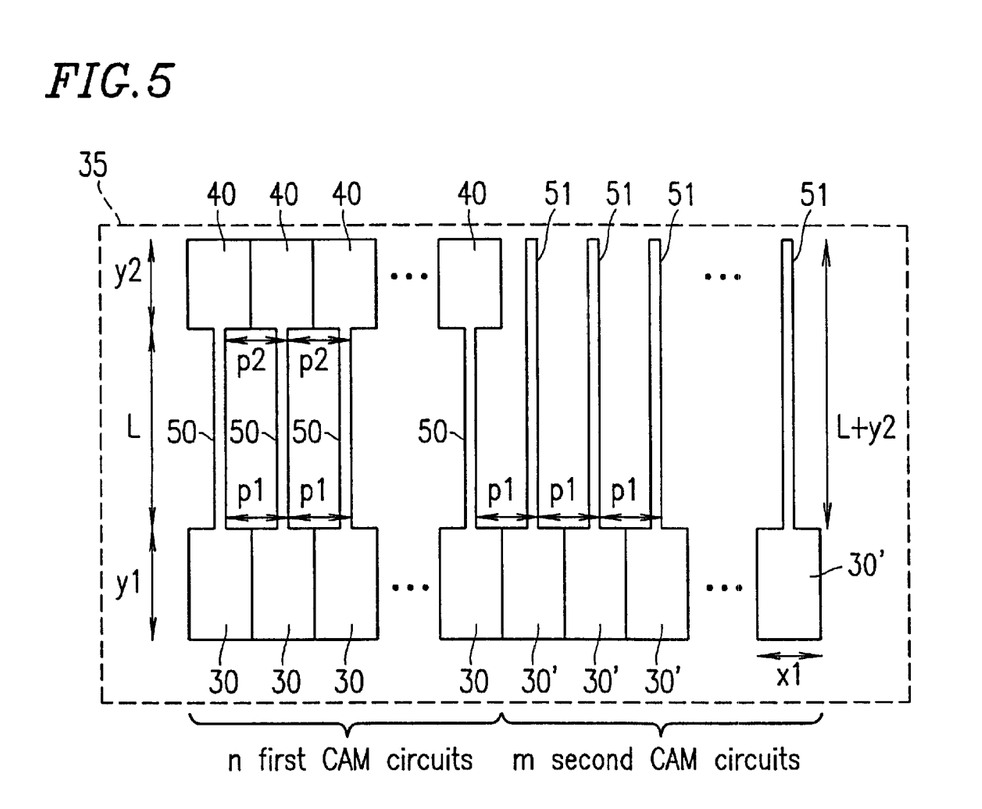
FIG. 5 is a layout of an example of a position of a conventional CAM region in a conventional semiconductor integrated circuit.

FIG. 5 shows an example of a layout of a CAM region 35 including the CAM circuits and redundancy relief address comparison circuits. In FIG. 5, the CAM region 35 includes n first CAM circuits 30, m second CAM circuits 30' and n redundancy relief address comparison circuits 40 (hereinafter, simply referred to as "comparison circuit 40"). Each of the n first CAM circuits 30 is connected by its respective conductor line 50 to a corresponding one of the n comparison circuits 40. Each of the m second CAM circuits 30' is connected by its respective conductor line 51 to a corresponding buffer circuit or the like (not shown). Each first CAM circuit 30 stores address information of a malfunctioning memory cell on which the redundancy relief is performed. Each second CAM circuit 30' stores information, such as a device code or the like, which is specific to the memory device and excludes the address information of the malfunctioning memory cell. Although the first and second CAM circuits 30 and 30' store different types of information and are connected to different types of elements, they are laid out in a similar manner.

As shown in FIG. 5, when pitch p1 between adjacent first CAM circuits 30 is equal to pitch p2 between adjacent comparison circuits 40, the first CAM circuits 30 can be connected to the corresponding comparison circuits 40 using the straight conductor lines 50, and therefore no unnecessary areas are provided in the circuit layout.

Figure 6:
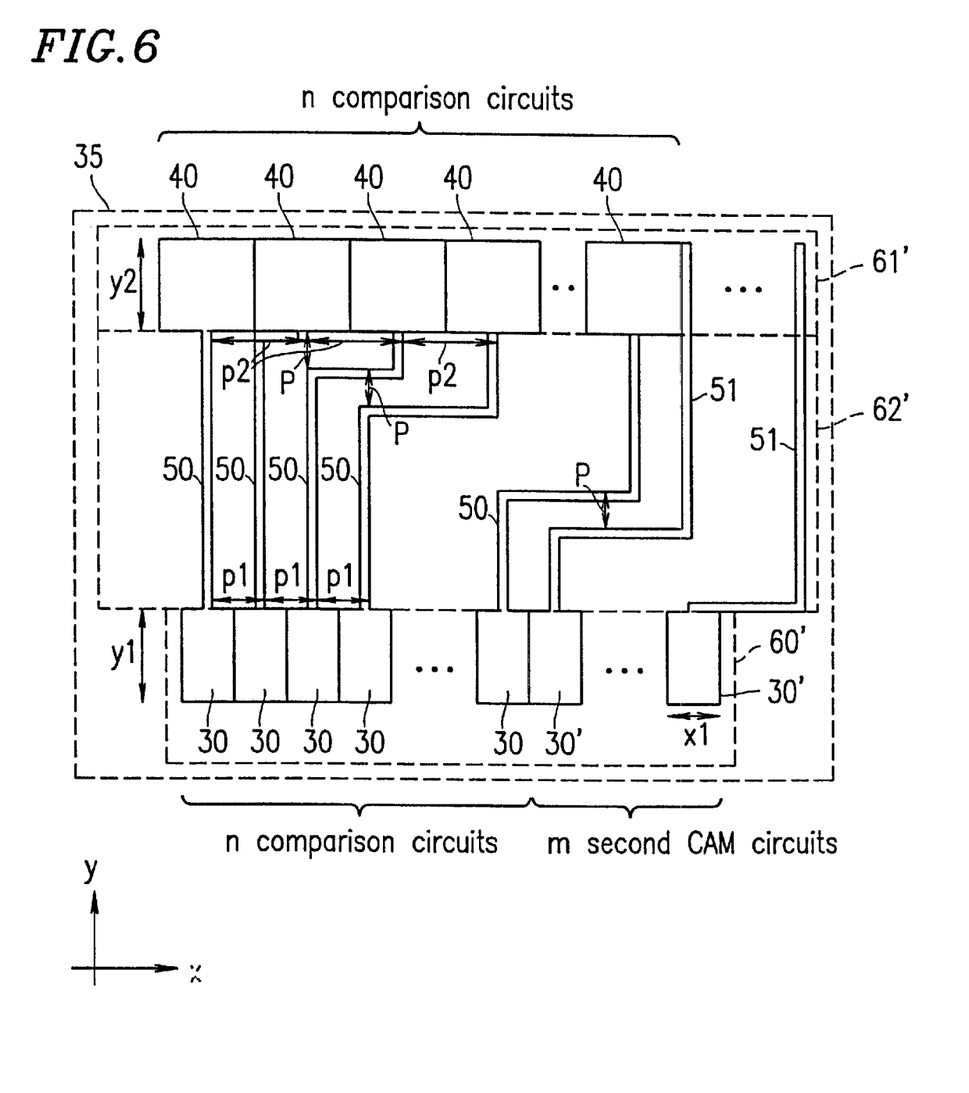
FIG. 6 is a layout of another example of the position of the conventional CAM region in the conventional semiconductor integrated circuit.

FIG. 6 shows another example of the layout of the CAM region 35. In FIG. 6, pitch p1 between the adjacent CAM circuits 30 is different from pitch p2 between the adjacent comparison circuits 40 and pitches p1 and p2 satisfy a relationship p2+W=2p1, where W denotes a width (not shown) of a single conductor line 50. In this case, the first CAM circuits 30 cannot be connected to corresponding comparison circuits 40 using straight conductor lines, and therefore the conductor lines 50 are required to be bent. Because of this, conductor lines 51 connected to the CAM circuits 30' are also required to be bent. This is the case regardless of whether or not the number n of the CAM circuits 30 and the number m of the CAM circuits 30' are the same.

However, when the conductor lines 50 and the conductor lines 51 are bent so as to connect the CAM circuits 30 to the comparison circuits 40 and connect the CAM circuits 30' to the buffer circuits or the like, a length of each of the conductor lines 50 and 51 is increased, thereby increasing the load on the conductor lines 50 and 51. Further, pitches between the adjacent conductor lines 50 and/or 51 along a direction denoted by y shown in FIG. 6 is required to be equal to or more than a prescribed minimum value P due to the necessities in a production process of the semiconductor integrated circuit (i.e., design rules). Therefore, a length along a direction denoted by y shown in FIG. 6 of a conductor region 62' is longer than length L along a direction denoted by y of a corresponding conductor region of FIG. 5, thereby increasing the size of the unnecessary area in the circuit layout. As a result, an area of the semiconductor chip is increased, thereby decreasing the number of semiconductor chips which can be fabricated on a single semiconductor wafer and increasing the cost of a single semiconductor chip.

In order to prevent an increase in area of the conductor region, the use of multilayer interconnections is considered. By using the multilayer interconnections so as to provide conductor lines in different conductor layers, conductor lines can be provided so as to overlap with one another in the different conductor layers, and therefore there is no need to provide pitches between the adjacent conductor lines along the y direction of FIG. 6. Accordingly, it is possible to prevent an increase in the length along the y direction of the conductor region 62' so as not to increase an area of the conductor region 62' as compared to the corresponding conductor region of FIG. 5, thereby increasing the number of semiconductor chips which can be fabricated on the semiconductor wafer so as to reduce the cost of producing a single semiconductor chip.

As described above, although an area of the conductor region can be reduced by using the multilayer interconnection, there are still problems as follows.

When providing the adjacent conductor lines so as to be in the different conductor layers, a conductor formation mask is required for each conductor layer in the steps of producing the semiconductor integrated circuit, thereby increasing the cost of producing the semiconductor integrated circuit. Further, by increasing the number of the conductor layers, the number of steps required for producing the semiconductor chip is also increased, thereby significantly increasing the cost of producing the semiconductor integrated circuit and also increasing the time required for completing the production of the semiconductor wafer.

Therefore, when the increase in the production cost caused by using the multilayer interconnection cannot be counterbalanced or overbalanced by reducing the production cost because of an increase in the number of semiconductor chips which can be fabricated on the single semiconductor wafer, no satisfactory effect can be achieved by using the multilayer interconnection. This is especially a considerable problem in semiconductor memories in which an area of the semiconductor chip is mostly occupied by memory cell regions.

Further, when the multilayer interconnection is locally used so as to reduce an area of the CAM region, there is a possibility that the entire area of the semiconductor chip is increased. The semiconductor integrated circuit includes circuit blocks other than the CAM circuits in an area around the CAM region. When the same conductor layer as that used for connecting the circuit blocks other than the CAM circuits is used in the CAM region, conductor lines for connecting the circuit blocks other than the CAM circuits are required to be provided so as to avoid the CAM region, or conductor lines used in another layer are required to be used in the CAM region.

When providing the conductor lines for connecting the circuit blocks other than the CAM circuits so as to avoid the CAM region, an entire area of the semiconductor chip is increased, thereby reducing the number of semiconductor chips which can be fabricated on the single semiconductor wafer. Therefore, the cost of a single semiconductor chip is increased. Alternatively, when using conductor lines for another layer in the CAM region, as described above, the conductor formation mask is required for each conductor layer, thereby increasing the number of production steps and increasing the cost of producing the semiconductor integrated circuit.

Based on the above-described reasons, in the flash memory, there is a need to reduce an area of the conductor region included in the CAM region without using multilayer interconnections.

SUMMARY OF THE INVENTION

According to one aspect of the present invention, there is provided a semiconductor integrated circuit which includes: n first output circuit blocks and m second output circuit blocks which are provided such that adjacent first and second output circuit blocks are spaced at a regular first pitch; and n input circuit blocks provided parallel to a direction along which the first and second output circuit blocks are provided, the input circuit blocks being provided such that adjacent input circuit blocks are spaced at a regular second pitch, in which the first and second output circuit blocks are provided such that at least part of ones of the first and second output circuit blocks alternate with the other ones of the first and second output circuit blocks and each of the first output circuit blocks is connected to a corresponding one of input circuit blocks by a first conductor line such that a length of the first conductor line is shortest between the first output circuit blocks and the corresponding ones of input circuit blocks, and second conductor lines are connected to the second output circuit blocks such that each second conductor line passes through a gap between the input circuit blocks.

With the above-described structure, even when the pitch between the adjacent first and second output circuit blocks are different from that between the adjacent input blocks, by alternately positioning the first and second output circuit blocks so as to be adjacent to one another, each of the first output blocks can be connected to a corresponding one of the input circuit blocks by its respective first conductor line such that the first conductor line is kept straight and has a length which is shortest between the first output circuit blocks and the corresponding ones of input circuit blocks. As a result, it is possible to shorten the length of the conductor lines so as to reduce the load provided on the conductor line as compared to the conventional technique which connects the input and output circuit blocks by bent conductor lines. Further, it is possible to prevent a length along a direction denoted by y as shown in FIG. 6 of a conductor line region from being increased in accordance with the pitches (a minimum value P) between the conductor lines which are required due to the necessities of production processes of the semiconductor integrated circuit (i.e., design rules). Furthermore, unlike the conventional technique in which the first and second circuit blocks are not alternately provided, the second conductor lines are connected to the second output circuit blocks such that each second conductor line passes through the gap between the input circuit blocks, and therefore it is not necessary to provide the pitches (a minimum value P) between the conductor wires which are required due to the necessities of production processes of the semiconductor integrated circuit, thereby preventing an increase in a length along a direction denoted by x as shown in FIG. 6 of a region in which the second conductor lines are provided. With this structure, it is possible to reduce an area of the conductor line region, and therefore it is possible to increase the number of semiconductor chips which can be fabricated on a single semiconductor wafer without using multilayer interconnections.

In one embodiment of the invention, layouts of the first and second output circuit blocks are identical.

In another embodiment of the invention, the semiconductor integrated circuit has a redundancy relief function for substituting a normal spare memory cell for a malfunctioning memory cell, each of the first output circuit blocks is a memory circuit for storing address information of the malfunctioning memory cell, each of the input circuit blocks is a comparison circuit for comparing the address information stored in the memory circuit and externally-input address information in which when the comparison results in a mismatch, access to a memory cell corresponding to the externally-input address is performed and when the comparison results in a match, access to the spare memory cell is performed.

In still another embodiment of the invention, the second pitch is twice as long as the first pitch.

Thus, the invention described herein makes possible the advantages of providing a semiconductor integrated circuit which can reduce an area of a conductor region provided for connecting a plurality of output circuits to a plurality of input circuits without using multilayer interconnections.

These and other advantages of the present invention will become apparent to those skilled in the art upon reading and understanding the following detailed description with reference to the accompanying figures.

DESCRIPTION OF THE PREFERRED EMBODIMENTS

Hereinafter, examples of the present invention will be described with reference to the drawings.

Figure 1:
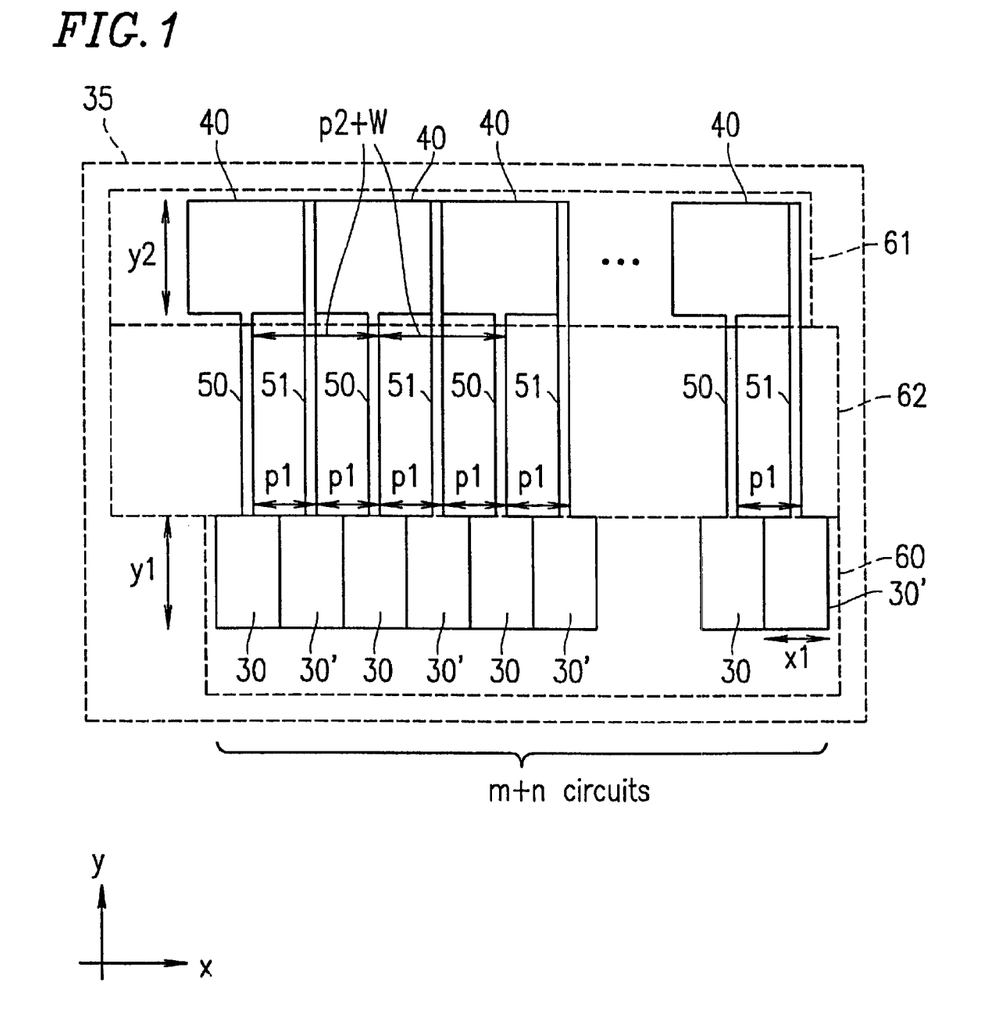
FIG. 1 is a layout showing an example of a position of a CAM region in a semiconductor integrated circuit according to the present invention.

FIG. 1 shows an example of a layout of the CAM region 35 including CAM circuits and redundancy relief address comparison circuits of a semiconductor integrated circuit according to the present invention. In FIG. 1, the CAM region 35 includes n first CAM circuits 30, m second CAM circuits 30' and n redundancy relief address comparison circuits 40 (hereinafter, each referred to as "comparison circuit 40"). Each first CAM circuit 30 stores address information of the malfunctioning memory cell on which the redundancy relief is performed. Each second CAM circuit 30' stores information, such as a device code or the like, which is specific to the memory device and excludes the address information of the malfunctioning memory cell.

The n first CAM circuits 30 and the m second CAM circuits 30' are provided such that the first CAM circuits 30 and the second CAM circuits 30' are alternately adjacent to each other and two adjacent comparison circuits 30 and 30' are spaced at a regular pitch p1. Then comparison circuits 40 are provided along a direction parallel to a direction along which the CAM circuits 30 and 30' are provided, such that two adjacent comparison circuits 40 are spaced at a regular pitch p2+W, where W denotes a width (not shown) of a conductor line 51. In order to simply describe FIG. 1, it is assumed that the relationships p2+W=2p1 and n=m are satisfied. Although the first and second CAM circuits 30 and 30' store different types of information and are connected to different types of elements, they include similar circuit elements and are laid out in a similar manner.

Each of the n first CAM circuits 30 is connected to a corresponding one of the n comparison circuits 40 by its respective n conductor line 50. Each of the m second CAM circuits 30' is connected to a corresponding buffer circuit or the like (not shown) by its respective m conductor line 51.

The comparison circuit 40 has a function of comparing the address information of the malfunctioning memory cell stored in the first CAM circuit 30 to externally-input address information. When the comparison results in a mismatch, a voltage required to perform read/write operations or the like is applied to a word line connected to a memory cell corresponding to the externally-input address. On the contrary, when the comparison results in a match, a voltage required to perform read/write operations or the like is applied to a word line connected to a spare (redundant) memory cell corresponding to the externally-input address. Since data cannot be read/written from/in the memory cell until the comparison circuit 40 completes the comparison between the address information of the malfunctioning memory cell stored in the first CAM circuit 30 and the externally-input address information, the comparison circuit 40 is preferably positioned in the vicinity of the word line voltage control circuit 23 (FIGS. 3 and 4). On the contrary, the CAM circuit 30' does not store the address information of the malfunctioning memory cell, and therefore unlike the comparison circuit 40, the buffer circuit or the like connected to the CAM circuit 30 is not severely restricted in its position and can be positioned away from the word line voltage control circuit 23.

In this example, as shown in FIG. 1, the CAM circuits 30, which store the address information required for performing the redundancy relief on the flash memory and have outputs connected to a corresponding one of the comparison circuits 40, and the second CAM circuits 30', which store the information specific to the memory device, are alternately positioned so as to be adjacent to one another. In this manner, by alternately positioning the first and second CAM circuits 30 and 30' so as to be adjacent to one another, the pitch between two adjacent first CAM circuits 30 and the pitch between two adjacent comparison circuits 40 can be made substantially the same such that corresponding pairs of the first CAM circuit 30 and the comparison circuit 40 can be connected together by the straight conductor lines 50. Further, the conductor line 51 for connecting the second CAM circuit 30' and the buffer circuit or the like can be provided so as to pass through a gap between the adjacent comparison circuits 40, and therefore there is no need to keep spaces so as to provide prescribed pitches between the adjacent conductor lines 51, i.e., the comparison circuit 40 fills each space between the adjacent conductor lines 51 in a region 61 shown in FIG. 1.

Effects of reducing an area of the CAM region of the present invention are described below by comparison with the conventional example shown in FIG. 6. As can be seen from FIGS. 1 and 6, an area of the CAM region 60 in which the first CAM circuits 30 and the second CAM circuits 30' are alternately positioned so as to be adjacent to one another and an area of the CAM region 60' (FIG. 6) in which the first CAM circuits 30 and the second CAM circuits 30' are separately positioned are determined by length x1 along the x direction and length y1 along the y direction of the CAM circuits 30 and 30', the number n of the CAM circuits 30 and the number m of the CAM circuits 30', and therefore the areas of the regions 60 and 60' are substantially the same.

Provided that when the minimum value of a pitch between the adjacent conductor lines is determined to be P by the necessities in the semiconductor production process, the conductor lines 51 in the region 61' shown in FIG. 6 are spaced at a pitch P. When a width of each of the conductor lines 51 shown in FIG. 6 and the conductor lines 51 is represented by W, a length along the y direction of the comparison circuit 40 is represented by y2 and a pitch between the comparison circuits 40 is represented by p2, the area of the region 61 shown in FIG. 1 is represented by S61=y2(np2+mW) and the area of the region 61' shown in FIG. 6 is represented by S61'=y2(np2+mP). In these expressions, W and P are positive numbers and satisfy the relationship P>W, and therefore the area of the region 61 is smaller than that of the region 61' by an area corresponding to a difference between the entire width of the conductor lines 51 and the entire space provided due to the pitches P between the adjacent conductor lines 51.

Further, in the conductor region 62' shown in FIG. 6, pitches P between the conductor lines are required along the y direction, and therefore the area of the conductor region 62 shown in FIG. 1 is smaller than that of the conductor region 62'.

Thus, according to the present invention, by alternately positioning the first and second CAM circuits 30 and 30' so as to be adjacent to one another, it is possible to reduce the entire area of the CAM region.

Although the example of the present invention is described with respect to a case where n and m are equal to each other, the same effects can also be achieved in the case where the n and m are not equal to each other. When n and m are not equal to each other, the equal number of the first and second CAM circuits 30 and 30' are alternately positioned and the remaining first or second CAM circuits 30 or 30' are positioned together.

As described above, according to this embodiment, even if a pitch between the adjacent first and second CAM circuits 30 and 30' is different from that between the adjacent comparison circuits 40 and the relationship p2+W=2p1 is satisfied, it is possible to reduce areas required for providing the conductor lines 50 for connecting the first CAM circuits 30 and the comparison circuits 40 and the conductor lines 51 for connecting the second CAM circuits 30' and the buffer circuits or the like. Further, both the pitches between the adjacent conductor lines 50 connected to the first CAM circuit 30 and the pitches between the adjacent conductor lines 51 connected to the second CAM circuits 30' are p1 which is greater than the minimum value P for a pitch determined by the necessities of the semiconductor production process, and therefore it is not necessary to further increase the pitches between the conductor lines 50 and 51 which are provided in the same layer of the circuit.

Although this example has been described with respect to a case where each CAM circuit is used as an output circuit block and each comparison circuit is used as an input circuit block, the present invention is not limited to such a configuration and is widely applicable to typical semiconductor integrated circuits including output circuit blocks and the input circuit blocks which are connected together by the conductor lines.

As described above, according to the present invention, even when the pitch between the adjacent CAM circuits is different from that between the adjacent comparison circuits, by alternately positioning the first CAM circuits connected to the comparison circuits and the second CAM circuits connected to the buffer circuits or the like, it is possible to connect the first CAM circuits to the comparison circuits by conductor lines which are kept straight. Accordingly, as compared to the conventional technique using the conductor lines which are required to be bent so as to connect the circuit blocks together, according to the present invention, it is possible to reduce the load provided on the conductor lines by shortening the length thereof and prevent the size of the semiconductor integrated circuit from being increased along the y direction as shown in the drawings, e.g., FIG. 1. Further, by providing the conductor lines for connecting the second CAM circuits and the buffer circuits or the like between the comparison blocks, it is possible to prevent the semiconductor integrated circuit from being increased along the x direction shown in the drawings, e.g., FIG. 1, as compared to the conventional technique which does not alternately position the first and second CAM circuits. Therefore, even if multilayer interconnection is used, it is possible to prevent increases in production cost and the time period required in the production steps by reducing the entire area of the regions required for providing the conductor lines.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor integrated circuit comprising:
    n first output circuit blocks and m second output circuit blocks which are provided such that adjacent first and second output circuit blocks are spaced at a regular first pitch; and
    n input circuit blocks provided parallel to a direction along which the first and second output circuit blocks are provided, the input circuit blocks being provided such that adjacent input circuit blocks are spaced at a regular second pitch,
    wherein the first and second output circuit blocks are provided such that at least part of ones of the first and second output circuit blocks alternate with the other ones of the first and second output circuit blocks and each of the first output circuit blocks is connected to a corresponding one of input circuit blocks by a first conductor line such that a length of the first conductor line is shortest between the first output circuit blocks and the corresponding ones of input circuit blocks, and
    second conductor lines are connected to the second output circuit blocks such that each second conductor line passes through a gap between the input circuit blocks.

2. A semiconductor integrated circuit according to claim 1, wherein layouts of the first and second output circuit blocks are identical.

3. A semiconductor integrated circuit according to claim 2, wherein:
    the semiconductor integrated circuit has a redundancy relief function for substituting a normal spare memory cell for a malfunctioning memory cell;
    each of the first output circuit blocks is a memory circuit for storing address information of the malfunctioning memory cell;
    each of the input circuit blocks is a comparison circuit for comparing the address information stored in the memory circuit and externally-input address information in which when the comparison results in a mismatch, access to a memory cell corresponding to the externally-input address is performed and when the comparison results in a match, access to the spare memory cell is performed.

4. A semiconductor integrated circuit according to claim 3, wherein the second pitch is twice as long as the first pitch.

5. A semiconductor integrated circuit according to claim 2, wherein the second pitch is twice as long as the first pitch.

6. A semiconductor integrated circuit according to claim 1, wherein:

the semiconductor integrated circuit has a redundancy relief function for substituting a normal spare memory cell for a malfunctioning memory cell;

each of the first output circuit blocks is a memory circuit for storing address information of the malfunctioning memory cell;

each of the input circuit blocks is a comparison circuit for comparing the address information stored in the memory circuit and externally-input address information in which when the comparison results in a mismatch, access to a memory cell corresponding to the externally-input address is performed and when the comparison results in a match, access to the spare memory cell is performed.

7. A semiconductor integrated circuit according to claim 3, wherein the second pitch is twice as long as the first pitch.

8. A semiconductor integrated circuit according to claim 1, wherein the second pitch is twice as long as the first pitch.

* * * * *